US005731226A

United States Patent [19]
Lin et al.

[11] Patent Number: 5,731,226
[45] Date of Patent: Mar. 24, 1998

[54] LOW TEMPERATURE METHOD OF MANUFACTURING EPITAXIAL TITANIUM SILICIDE

[75] Inventors: Jiunn Hsien Lin, Yungkang; Shuh-Ren Chen, Hsinchu, both of Taiwan

[73] Assignee: United Microelectronics Corporation, Taipei, Taiwan

[21] Appl. No.: 740,692

[22] Filed: Nov. 1, 1996

[30] Foreign Application Priority Data

Aug. 17, 1996 [TW] Taiwan ............................ 85110060

[51] Int. Cl.⁶ .................................................. H01L 21/283
[52] U.S. Cl. ................................. 437/200; 437/192
[58] Field of Search .......................... 437/415 M, 190, 437/192, 200

[56] References Cited

U.S. PATENT DOCUMENTS

| 4,920,073 | 4/1990 | Wei et al. | 437/200 |
|---|---|---|---|
| 4,923,822 | 5/1990 | Wang et al. | 437/41 |
| 5,202,579 | 4/1993 | Fujii et al. | 257/751 |

OTHER PUBLICATIONS

Wang, M., et al., "Phase Formation . . . ", J. Appl. Phys., 71(12), 15 Jun. 1992, pp. 5918–5925.

Tsukamoto, K., et al., "Self–aligned Titanium . . . " 2419 Jap. J. Appl. Phys. Suppl. Aug. 1984, pp. 47–51.

Shatas, S., et al., "Workshop on Refractory Metal Silicides", Sep. 1983, San Juan Bautista, California, pp. 7–20.

Primary Examiner—T. N. Quach
Attorney, Agent, or Firm—Rabin, Champagne & Lynt, P.C.

[57] ABSTRACT

A method of manufacturing epitaxial titanium silicide in a metal silicide processing has a lower than usual processing temperature requirement, and is therefore suitable for use in the manufacturing of integrated circuits. The epitaxial titanium silicide so formed is made without a grain boundary and is thus capable of lowering the electrical resistance of the titanium silicide. First, a silicon substrate with an exposed crystalline silicon layer on the surface is provided. Then a titanium layer and a titanium nitride layer are sequentially formed. Finally, using a rapid thermal processing, an epitaxial titanium silicide layer is formed.

2 Claims, 2 Drawing Sheets

LOW TEMPERATURE METHOD OF MANUFACTURING EPITAXIAL TITANIUM SILICIDE

BACKGROUND OF THE INVENTION

1. Field of the Invention

This invention relates in general to a semiconductor manufacturing technique, and more particularly to a method of manufacturing epitaxial titanium silicide in a metal silicide manufacturing process.

2. Description of the Related Art

With the advantages of high melting point, good stability and low resistivity, the use of refractory metal silicide in semiconductor manufacturing is becoming more and more common. One of its main applications is to increase the ohmic contact between aluminium metal and silicon. For example, when the level of integration of MOS transistor components increases, the resistance of the source and drain terminals in a MOS transistor component gradually rises until it is comparable to the resistance of the MOS channel. To adjust and lower the sheet resistance of the source and drain terminals, and to ensure the shallow junction between the metal terminal and the MOS transistor remains intact, the use of metal silicide has become necessary.

Another application of refractory metal silicide is in the production of a semiconductor gate. At present, although polysilicon is used in most gate production due to its good adhesive strength with silicon dioxide ($SiO_2$) and processing compatibility, problems still exist, such as its high resistance even after doping. Therefore, polysilicon is not quite suitable alone to the application of gate layer formation in a MOS transistor. Hence, it is common to have a layer of refractory metal silicide, such as titanium silicide ($TiSi_2$) or tungsten silicide ($WSi_2$), added to the surface of the polysilicon. Because metal silicide has a better electrical conductivity, it can lower the RC delay time of resistor/capacitor components. Further, a conducting layer composed of polysilicon and metal silicide is capable of much better electrical operation as a gate terminal, for example, than using a polysilicon layer alone.

Metal silicides can be divided into polycrystalline and epitaxial forms, and unlike the polycrystalline form, the epitaxial form has no lattice defects and no grain boundary, and so can provide a lower resistance, better electrical properties and an increase in adhesive strength, and is therefore more suitable for semiconductor manufacturing applications.

At present, conventional techniques for manufacturing epitaxial titanium silicide, for example, are roughly divided into two main categories, namely, the molecular beam epitaxy method and the solid phase epitaxy method. The molecular beam epitaxy method operates under an ultrahigh vacuum condition, with a pressure of about $10^{-11}$ Torr and a temperature between about 600°–900° C. Heat is applied to vaporize silicon and titanium until a supersaturated atmosphere of the gases is reached. The vaporized silicon and titanium atoms are accelerated and deposited on the surface of a silicon wafer, forming titanium silicide grains which finally grow into an epitaxial titanium silicide layer. Although the thickness of the deposited epitaxial titanium silicide can be precisely controlled in this method, one big disadvantage lies in its slow deposition rate, i.e., almost a day for each silicon wafer. Moreover, the required equipment is very expensive and therefore this method is not very cost effective.

The solid phase epitaxy method makes use of ion implantation to dope titanium ions into the surface of crystalline silicon. However, these high energy titanium ions can cause structural damage to the silicon layer on the surface of a silicon wafer and changes the original stable lining of crystalline silicon into an amorphous silicon. Therefore, a rapid thermal annealing method is employed. With a temperature raised to about 1000° C. within a very short time period, the damaged amorphous silicon is annealed by the heat and reverts back to an epitaxial state of epitaxial titanium silicide. However, a disadvantage of this method is the high temperature of about 1000° C. required in thermal processing, which can adversely affect gates and polysilicon layers elsewhere on the wafer. Moreover, production is slow, and is therefore not suitable for use in the manufacturing of semiconductors.

SUMMARY OF THE INVENTION

It is therefore an object of the invention to provide a method of manufacturing epitaxial metal silicide at a lower temperature and which is suitable for the manufacturing of integrated circuits.

To achieve the above object of this invention, an epitaxial titanium silicide manufacturing method includes the following steps:

(a) a silicon substrate with an exposed crystalline silicon layer on the surface is provided;

(b) a titanium layer and a titanium nitride layer are sequentially formed; and (c) an epitaxial titanium silicide layer is formed.

BRIEF DESCRIPTION OF THE DRAWINGS

Other objects, features, and advantages of the invention will become apparent from the following detailed description of the exemplary preferred but non-limiting embodiment. The description is made with reference to the accompanying drawings in which.

DETAILED DESCRIPTION OF A PREFERRED EMBODIMENT

Because the epitaxial metal silicide is formed on the surface of a crystalline silicon layer, and because crystalline silicon layers appear in a number of places in integrated circuits, for example, a silicon substrate, gate terminal, the load of static random access memory (SRAM), the bit line of SRAM, etc., for the sake of convenience, this preferred embodiment is explained in terms of a gate terminal and the surface of a silicon substrate. For those who are familiar with such technologies, it should be readily apparent that this invention can be applied to other areas as well.

Figure 1A:
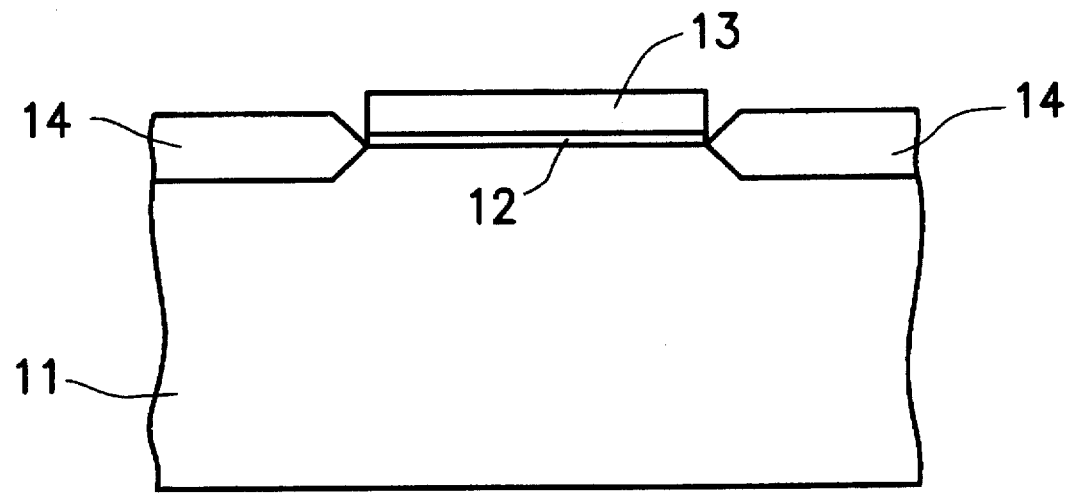
FIGS. 1A to 1D are cross-sectional views showing the manufacturing process according to a preferred embodiment of this invention.

First, referring to FIG. 1A, on a silicon substrate 11, a silicon dioxide layer 12 and a silicon nitride layer 13 are formed, for example, using a chemical vapor deposition (CVD) method. Then, using photolithographic and etching processes, such as a dry plasma etching method, active regions are patterned. Thereafter, using a thermal oxidation method, for example, wet oxidation at a temperature of about 1000° C., field oxide layer 14 is formed.

Figure 1B:
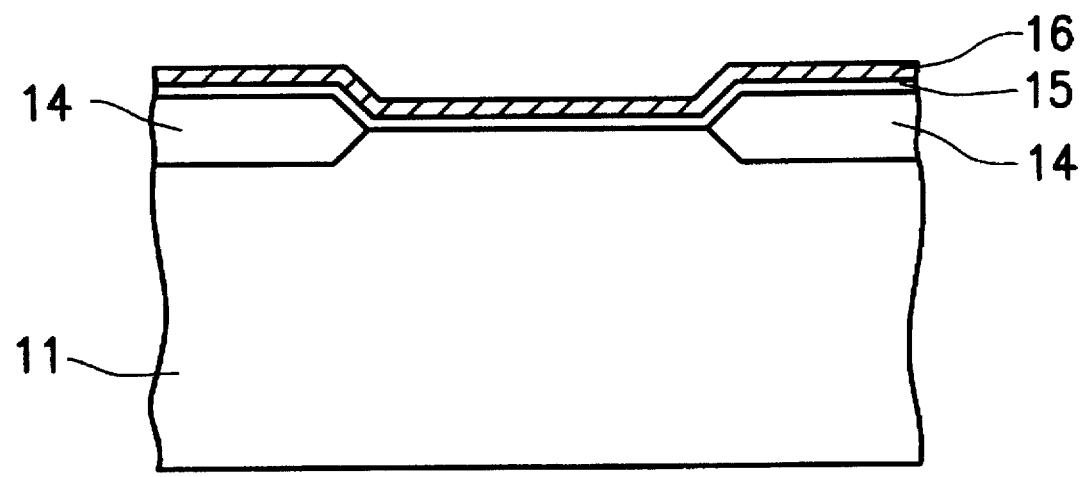

Referring next to FIG. 1B, the silicon dioxide layer 12 and silicon nitride layer 13 are removed by a wet etching method. Then, on the silicon substrate 11 surface, a silicon dioxide layer with a thickness between about 100Å to 250Å is formed, for example, using a dry oxidation method, to act as gate oxide layer 15. Next, a polysilicon layer 16 with a thickness between about 1000Å to 2000Å is formed above the silicon substrate 11, for example, using a chemical vapor deposition (CVD) method.

Figure 1C:
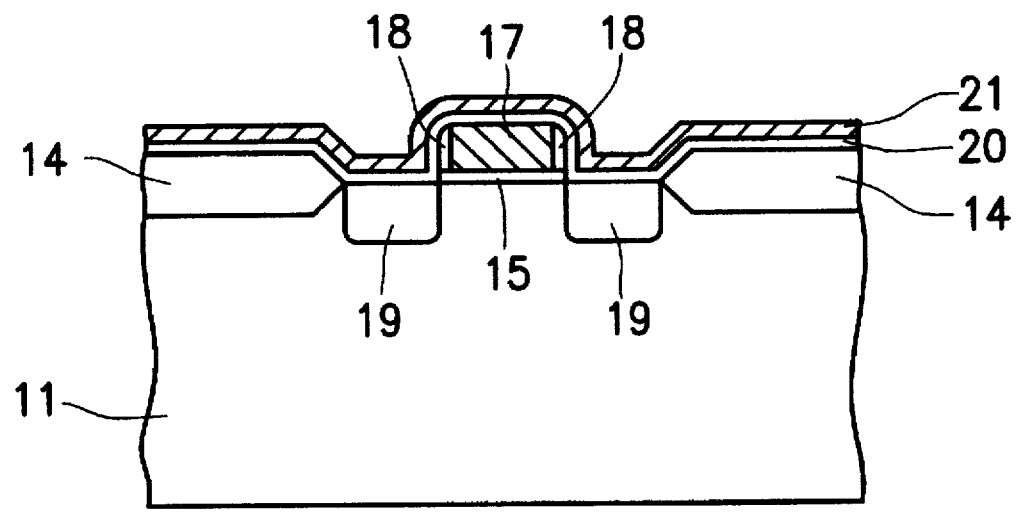

Referring to FIG. 1C, using photolithographic and etching processes, a pattern is defined on the polysilicon layer 16 and the gate oxide layer 15 to form the gate terminal 17. Thereafter, spacers 18 are formed on the two sidewalls of the gate terminal 17, such as by a silicon dioxide layer. Ion implantation to form the source/drain terminals 19 follows. Then, a metallic layer 20, such as a titanium layer with a thickness, for instance, of about 1000Å, is formed. The titanium layer 20 is formed, for example, by using a magnetron DC sputtering method and argon gas. Next, a titanium nitride layer 21 with a thickness between about 300Å to 800Å is formed above the titanium layer 20, for example, using a reactive sputtering method with nitrogen and argon gases. The titanium layer 20 and the titanium nitride layer 21 can be sequentially formed in the same reaction chamber by simply controlling the closing and opening of the nitrogen gas supply.

Figure 1D:
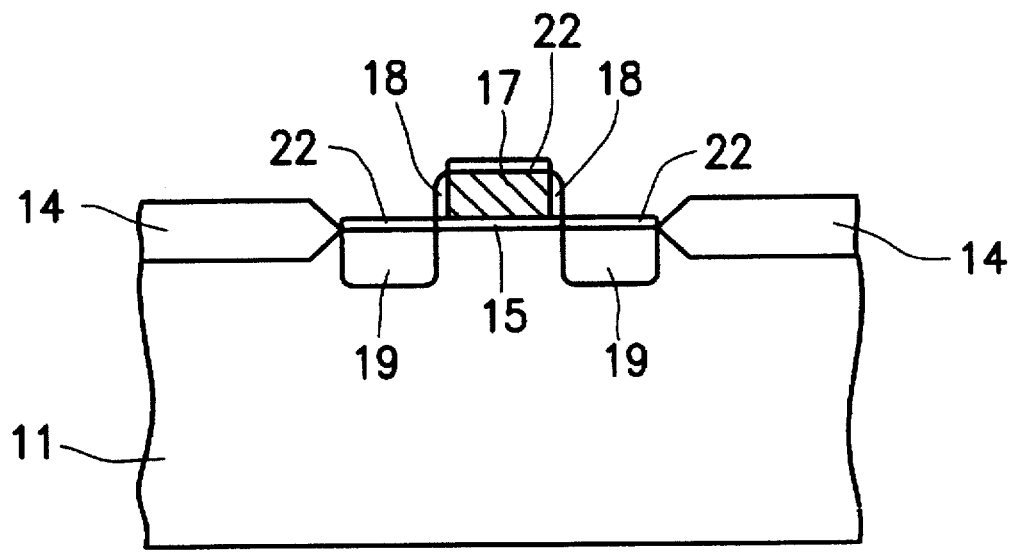

Referring to FIG. 1D, using a thermal processing method, such as rapid thermal processing at a temperature of 750° C., titanium layer 20 reacts with gate terminal 17 and the surfaces of drain/source terminals 19, respectively, to form titanium silicide layer 22. Due to the coverage by a titanium nitride layer 21 above, a larger grain titanium silicide is formed in the titanium silicide layer 22, and ultimately forms an epitaxial titanium silicide layer without any grain boundary. Because titanium layer 20 cannot react with a silicon dioxide layer, a wet etching method can be employed to remove the unreacted titanium layer 20 and the titanium nitride layer 21 above it.

As those who are familiar with such technologies will understand, application of the epitaxial titanium silicide manufacturing method of this invention has the following advantages:

(1) The reaction temperature of about 750° C. used in this manufacturing process is comparatively lower than in other processes used in the past, and therefore is more suitable for the manufacturing of integrated circuits.

(2) There is no grain boundary in the epitaxial titanium silicide layer so formed, and therefore resistance of the titanium silicide is lower, besides providing a reduction in interfacial leakage current between the titanium silicide and silicon layer.

(3) The epitaxial titanium silicide so formed has a higher conducting speed and therefore is suitable for the manufacturing of an SRAM bit line, for example.

While the invention has been described by way of example and in terms of a preferred embodiment, it is to be understood that the invention not be limited thereto. To the contrary, it is intended that the invention cover various modifications and similar arrangements within the spirit and scope of the appended claims, which should be accorded the broadest interpretation so as to encompass all such modifications and similar arrangements.

What is claimed is:

1. A refractory metal silicide manufacturing process, comprising:

providing in a reaction chamber, a semiconductor substrate having an exposed crystalline silicon layer on the surface thereof, wherein the exposed crystalline silicon layer is at least one of:

the silicon substrate, or a polysilicon layer disposed on the silicon substrate;

forming a titanium layer having a thickness of about 1000Å, over the exposed layer of crystalline silicon using a magnetron DC sputtering method with argon gas;

forming a titanium nitride layer having a thickness of between about 300Å and 800Å, over the titanium layer using a reactive sputtering method with argon and nitrogen gases;

without removing the titanium nitride layer, forming an epitaxial titanium silicide layer by reaction of the titanium layer with the exposed crystalline silicon layer, using rapid thermal processing at a temperature of about 750° C., the epitaxial titanium silicide layer being formed without a grain boundary; and using a wet etching process, removing unreacted titanium and titanium nitride.

2. The process according to claim 1, wherein the titanium and titanium nitride layers are formed sequentially in the same reaction chamber by controlling a nitrogen gas supply.

\* \* \* \* \*